US011798157B2

(12) United States Patent
Deotare et al.

(10) Patent No.: US 11,798,157 B2
(45) Date of Patent: Oct. 24, 2023

(54) NON-DESTRUCTIVE IMAGING TECHNIQUES FOR INTEGRATED CIRCUITS AND OTHER APPLICATIONS

(71) Applicant: THE REGENTS OF THE UNIVERSITY OF MICHIGAN, Ann Arbor, MI (US)

(72) Inventors: Parag Deotare, Ann Arbor, MI (US); Zidong Li, Ann Arbor, MI (US); Kanak Datta, Ann Arbor, MI (US)

(73) Assignee: THE REGENTS OF THE UNIVERSITY OF MICHIGAN, Ann Arbor, MI (US)

( * ) Notice: Subject to any disclaimer, the term of this patent is extended or adjusted under 35 U.S.C. 154(b) by 524 days.

(21) Appl. No.: 17/066,976

(22) Filed: Oct. 9, 2020

(65) Prior Publication Data
US 2021/0110524 A1 Apr. 15, 2021

Related U.S. Application Data

(60) Provisional application No. 62/977,533, filed on Feb. 17, 2020, provisional application No. 62/913,771, filed on Oct. 11, 2019.

(51) Int. Cl.
*G01R 31/308* (2006.01)
*G06T 7/00* (2017.01)
(Continued)

(52) U.S. Cl.
CPC ......... *G06T 7/001* (2013.01); *G01R 31/2656* (2013.01); *G01R 31/308* (2013.01);
(Continued)

(58) Field of Classification Search
CPC .......... G06T 7/001; G06T 2207/30148; H01L 22/20; H01L 22/12; H01L 22/14;
(Continued)

(56) References Cited

U.S. PATENT DOCUMENTS 6,959,255 B2   10/2005   Ye et al.
7,302,090 B2   11/2007   Kalus et al.
(Continued)

OTHER PUBLICATIONS

Beige, A.; Pachos, J.; Walther, H. Spontaneous Emission of an Atom in Front of a Mirror. *Phys. Rev. A—At. Mol. Opt. Phys.* 2002. https://doi.org/10.1103/PhysRevA.66.063801.
(Continued)

*Primary Examiner* — Raul J Rios Russo
(74) *Attorney, Agent, or Firm* — Harness, Dickey & Pierce, P.L.C.

(57) ABSTRACT

The present disclosure relates to non-destructive methods for collecting data from three-dimensional objects. Method include directing one or more interrogating beams of light towards a surface of a three-dimensional object, where the three-dimensional object includes one or more underlying surfaces, and one or more materials having excitonic properties are disposed on the surface of the three-dimensional object; capturing, using an imaging device, optic response of the one or more materials having excitonic properties to the one or more interrogation beams; and computing, using the imaging device, a distance between the one or more underlying surfaces and the one or more materials having excitonic properties, where the optic response of the one or more materials having excitonic properties is a function of the distance between the one or more materials having excitonic properties and the one or more underlying surfaces.

20 Claims, 7 Drawing Sheets

(51) Int. Cl.
*H01L 21/66* (2006.01)
*G01R 31/311* (2006.01)
*G01R 31/265* (2006.01)

(52) U.S. Cl.
CPC ............ *G01R 31/311* (2013.01); *H01L 22/20* (2013.01); *G06T 2207/30148* (2013.01); *H01L 22/12* (2013.01); *H01L 22/14* (2013.01); *H01L 2924/00* (2013.01)

(58) Field of Classification Search
CPC .............. H01L 2924/00; G01R 31/311; G01R 31/2656; G01R 31/308; G01N 21/956
USPC ......... 324/71, 378, 403, 415, 425, 500, 537, 324/754.01, 754.21, 754.23
See application file for complete search history.

(56) References Cited

U.S. PATENT DOCUMENTS

| | | |
|---|---|---|
| 9,897,560 B2 | 2/2018 | Martin et al. |
| 10,460,326 B2 | 10/2019 | Spory |
| 2004/0257566 A1* | 12/2004 | Chism, II ............... B82Y 20/00 356/369 |
| 2007/0019209 A1* | 1/2007 | Pfaff .................... G01R 31/311 356/521 |
| 2009/0002717 A1* | 1/2009 | Pfaff .................... G01R 15/241 356/521 |
| 2015/0078518 A1 | 3/2015 | Tziazas et al. |
| 2016/0313395 A1* | 10/2016 | Ünlü .................. G01R 31/2856 |
| 2018/0246045 A1 | 8/2018 | Pfaff |
| 2020/0305274 A1* | 9/2020 | Pizzuti ................. H05K 1/0269 |

OTHER PUBLICATIONS

Tsutsui, T.; Adachi, C.; Saito, S.; Watanabe, M.; Koishi, M. Effect of Confined Radiation Field on Spontaneous-Emission Lifetime in Vacuum-Deposited Flourescent Dye Films. Chem. Phys. Lett. 1991, 182 (2), 143-146. https://doi.org/10.1016/0009-2614(91)80118-H.

Drexhage, K.H. Influence of a Dielectric Interface on Fluorescence Decay Time. J. Lumin. 1970. https://doi.org/10.1016/0022-2313(70)90082-7.

Ahi K, Shahbazmohamadi S, and Asadizanjani N. Quality control and authentication of packaged integrated circuits using enhanced-spatial-resolution terahertz time-domain spectroscopy and imaging. Optics and Lasers in Engineering. 2018. 104; 274-284.

Mahmood K., Carmona L., Shahbazmohamadi S et al. Real-time automated counterfeit integrated circuit detection using x-ray microscopy. Applied Optics. 2015. 54(13):D25-D32.

* cited by examiner

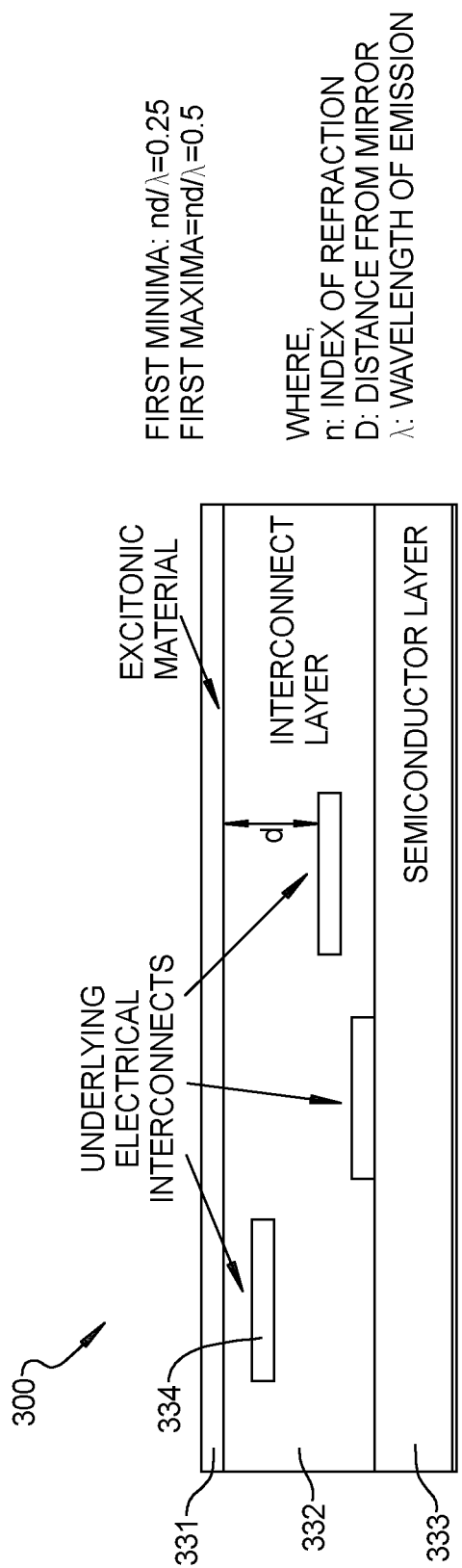

(a)

(b)

(c)

NON-DESTRUCTIVE IMAGING TECHNIQUES FOR INTEGRATED CIRCUITS AND OTHER APPLICATIONS

CROSS-REFERENCE TO RELATED APPLICATIONS

This application claims the benefit of U.S. Provisional Application No. 62/977,533, filed on Feb. 17, 2020 and U.S. Provisional Application No. 62/913,771, filed on Oct. 11, 2019. The entire disclosures of each of the above applications are incorporated herein by reference.

FIELD

The present disclosure relates to non-destructive imaging techniques for integrated circuits and other applications.

BACKGROUND

Changes in the photo physical properties, such as intensity, emission rate, diffusion, etc. of an excitonic material, can be utilized to form a topography map. For example, the emission intensity (and rate) from a direct band gap semiconductor can be affected by its proximity to a mirror. This is a result of change in the local density of optical states due to constructive or destructive interference. For an integrated circuit ("IC"), embedded electrical interconnects (i.a, metal wires) can act as mirrors and as such alter the intensity (or rate of emission) of emitted light, providing a direct readout of the underlying depth of the metal interconnects. These principles enable non-destructive techniques for imaging an integrated circuit, which can be used to generate topography images of an integrated circuit for counterfeit detection. Further, since the photo physical properties are dependent on the depth of the interconnect, the imaging techniques can also be used as a barcode for integrated circuits.

This section provides background information related to the present disclosure which is not necessarily prior art.

SUMMARY

This section provides a general summary of the disclosure, and is not a comprehensive disclosure of its full scope or all of its features.

In various aspects, the present disclosure provides a non-destructive method for collecting data from three-dimensional objects. The method may include directing one or more interrogating beams of light towards a surface of a three-dimensional object, where the three-dimensional object includes one or more underlying surfaces, and one or more materials having excitonic properties are disposed on the surface of the three-dimensional object; capturing, using an imaging device, optic response of the one or more materials having excitonic properties to the one or more interrogation beams; and computing, using the imaging device, a distance between the one or more underlying surfaces and the one or more materials having excitonic properties, where the optic response of the one or more materials having excitonic properties is a function of the distance between the one or more materials having excitonic properties and the one or more underlying surfaces.

In one aspect, the one or more materials having excitonic properties may form an excitonic layer.

In one aspect, the excitonic layer may include at least one of an organic semiconductor thin film and an inorganic semiconductor thin film.

In one aspect, the excitonic layer may be blended layer including inorganic and organic materials.

In one aspect, the method may further include disposing the excitonic layer on the surface of the three-dimensional object.

In one aspect, the three-dimensional object may be an integrated circuit.

In one aspect, the method may further include comparing the distance between the one or more underlying surfaces and the excitonic layer to a product specification for the integrated circuit; and tagging the integrated circuit as a counterfeit when the distance between the one or more underlying surfaces and the excitonic layer differs substantially from the product specification for the integrated circuit.

In one aspect, the method may further include disposing a transparent material on exposed surfaces of the one or more underlying surfaces and disposing the excitonic layer on an exposed surface of the transparent material so as to define the surface of the three-dimensional object.

In one aspect, the three-dimensional object may be a barcode.

In one aspect, wavelengths of the one or more interrogating beam may be different from the optic response wavelengths emitted from the one or more materials having excitonic properties.

In one aspect, wavelengths of the one or more interrogating beam may be shorter than the optic response wavelengths emitted from the one or more materials having excitonic properties.

In one aspect, wavelengths of the one or more interrogating beam may be longer than the optic response wavelengths emitted from the one or more materials having excitonic properties.

In one aspect, the one or more interrogating beams of light may be directed towards an exposed surface of three-dimensional object using one or more lasers.

In one aspect, the method may further include injecting an electric signal into the three-dimensional object while directed the one or more interrogating beams of light towards the surface of the three-dimensional object.

In one aspect, the method may further include monitoring exciton drift over time in the optical response of the one or more materials having excitonic properties while the electrical signal is injected into the three-dimensional object.

In various other aspects, the present disclosure provides a non-destructive method for collecting data from an integrated circuit. The method may include directing one or more interrogating beam of light towards a surface of the integrated circuit, where the integrated circuit includes one or more interconnects, and an excitonic layer including one or more materials having excitonic properties is disposed on the surface of the integrated circuit; capturing, using an imaging device, optic response of the excitonic layer to the one or more interrogation beams; and computing, using the imaging device, a distance between the one or more interconnects and the excitonic layer, where the optical response of the one or more materials having excitonic properties is a function of the distance between the excitonic layer and the one or more interconnects.

In one aspect, the method may further include constructing a three-dimensional image of the integrated circuit.

In one aspect, the method may further include comparing the distance between the one or more underlying surfaces and the excitonic layer to a product specification for the integrated circuit; and tagging the integrated circuit as a counterfeit when the distance between the one or more underlying surfaces and the excitonic layer differs substantially from the product specification for the integrated circuit.

In various other aspects, the present disclosure provides a non-destructive method for collecting data from a three-dimensional barcode. The method may include directing one or more interrogating beam of light towards a surface of the barcode, where the barcode includes a plurality of objects having different heights, plurality of objects define a pattern, and an excitonic layer including one or more materials having excitonic properties is disposed on the surface of the barcode; capturing, using an imaging device, optic response of the excitonic layer to the one or more interrogation beams; and computing, using the imaging device, a distance between the objects and the excitonic layer, where the optical response of the one or more materials having excitonic properties is a function of the distance between the excitonic layer and the plurality of objects.

In one aspect, the method further includes disposing a transparent material on exposed surfaces of the objects and disposing the excitonic layer on an exposed surface of the transparent material so as to define the surface of the barcode.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

FIG. 3 is a cross sectional view of an example integrated circuit;

Figure 5:
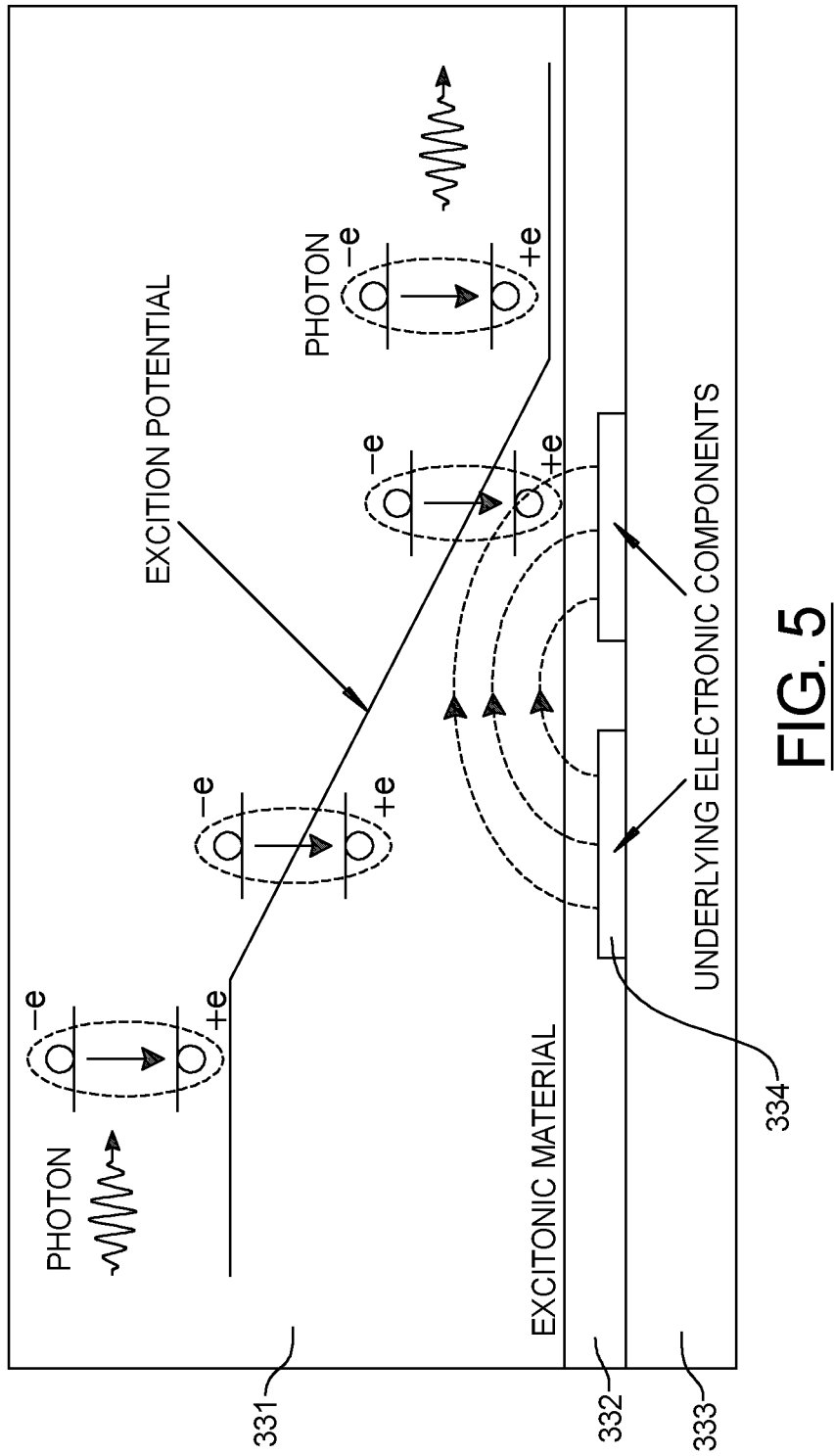
Figure 6A:
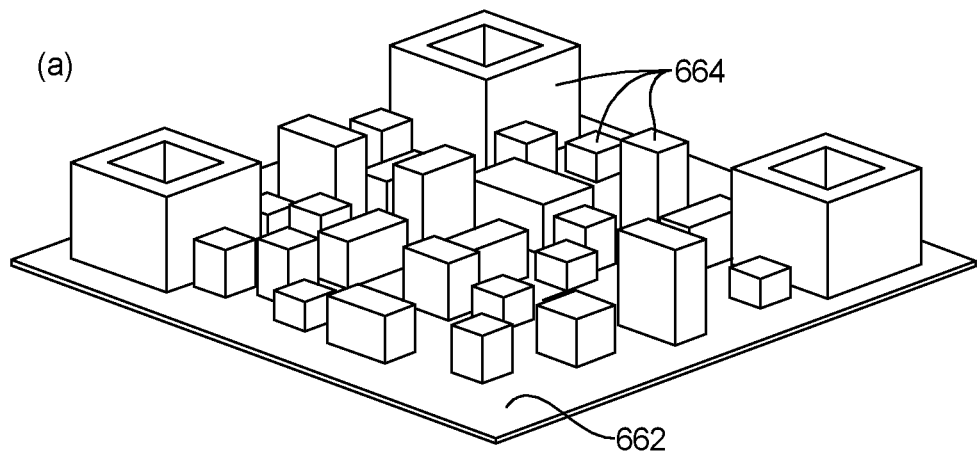
Figure 6B:
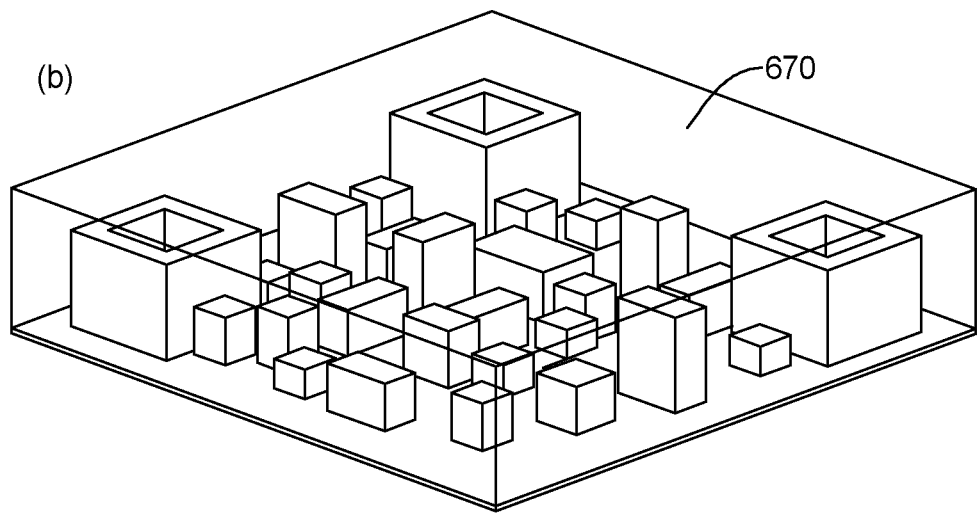
Figure 6C:
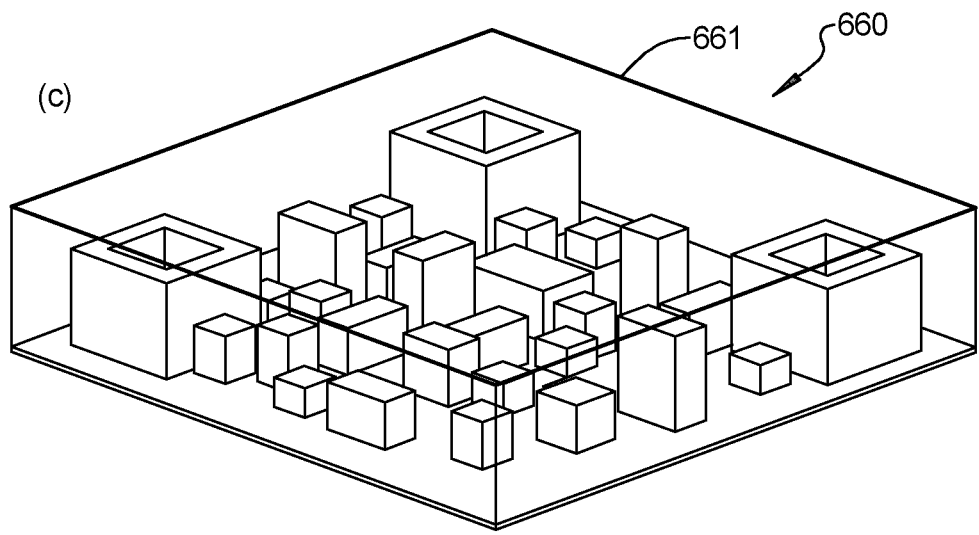

FIG. 5 is a diagram illustrating the effect of local electric field created by underlying electronic components in an integrated circuit, such as the example integrated circuit illustrated in FIG. 3, on the nearby excitonics molecules, where the fields induce shifts in the energy bands not only affecting the exciton lifetime but also altering the exciton potential which acts as a driving force for exciton diffusion (drift);

FIG. 6A is an area perspective view of a bar code having different depth profiles;

FIG. 6B is the bar code having different depth profiles as illustrated in FIG. 6A immersed within a transparent material; and FIG. 6C is the bar code having different depth profiles and immersed within a transparent material as illustrated in FIG. 6B having an excitonic material layer.

Corresponding reference numerals indicate corresponding parts throughout the several views of the drawings.

DETAILED DESCRIPTION

Example embodiments will now be described more fully with reference to the accompanying drawings.

Figure 1A:
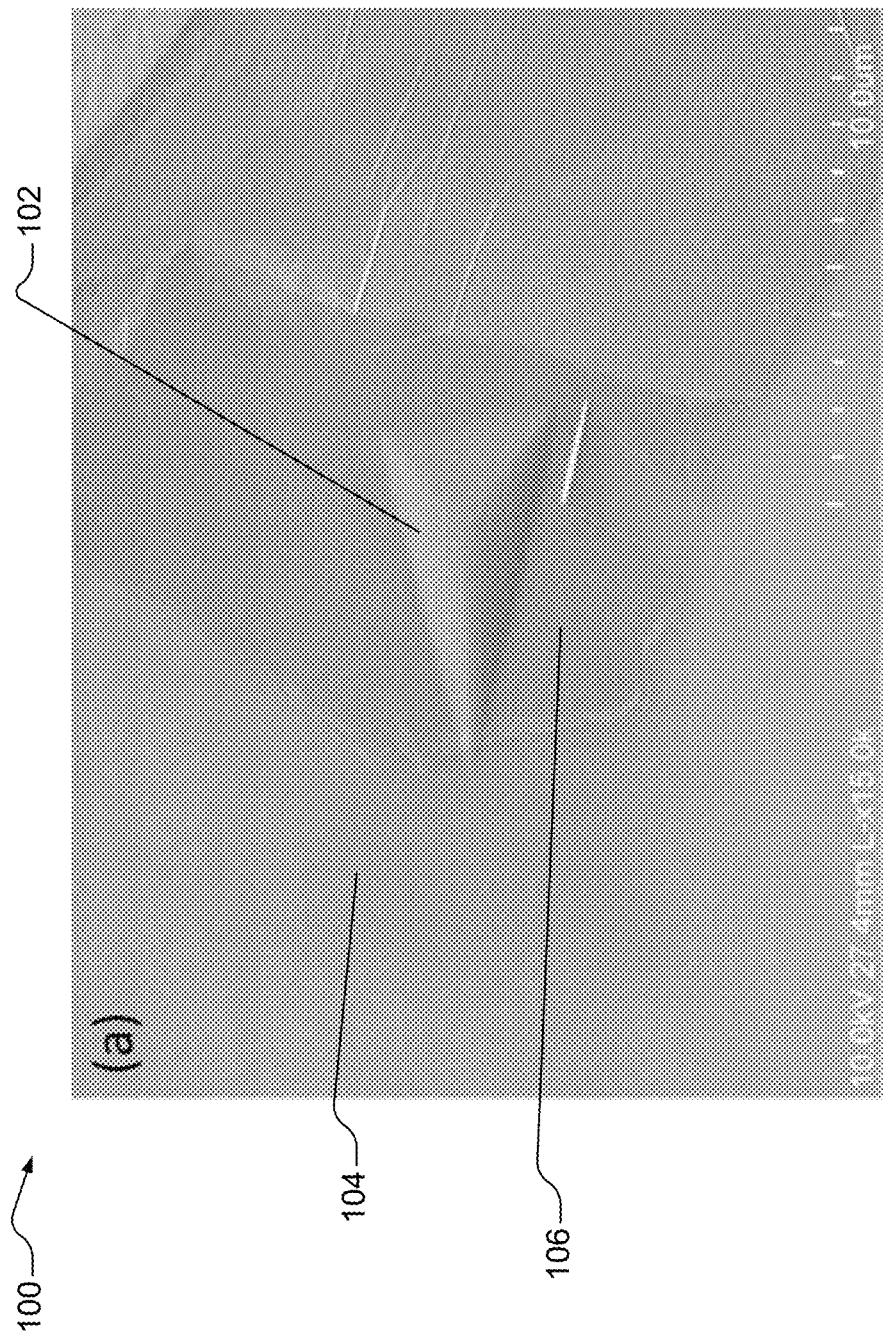
FIG. 1A is a scanning electron microscope ("SEM") image of excitonic material deposited on a nanofabricated wedge, where the wedge is used to vary the distance of the excitons from the underlying substrate, which acts as a mirror.
Figure 1B:
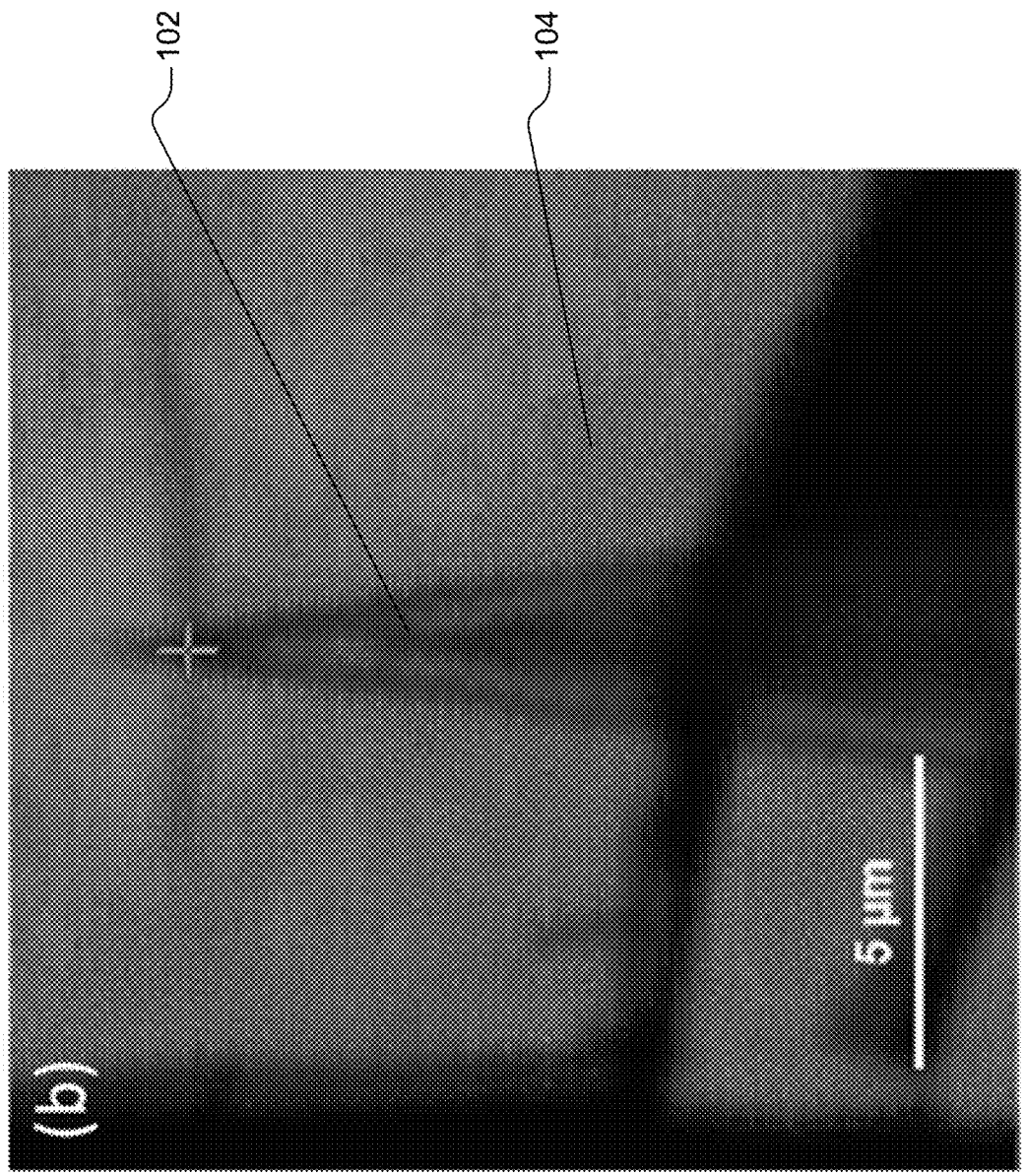
FIG. 1B is a photoluminescence lifetime image of the wedge illustrated in FIG. 1A, the photoluminescence lifetime image shows a clear interference pattern confirming the change in local density of optical states and revealing depth information.

FIGS. 1A and 1B demonstrate the effect of change in local density of optical states ("LDOS") when an underlying mirror is present. The example 100 includes one or more nanofabricated wedges 102 disposed on a surface of a substrate 104. The substrate 104 may act as a mirror. The nanofabricated wedge 102 may comprise silicon dioxide ($SiO_2$). The substrate 104 may comprise silicon. One or more excitonic material 106 may be deposited on each wedge 102. Although other types of excitonic materials are contemplated by this disclosure, Van der Waal ("vdw") excitonic materials, such as organic dyes and transition metal dichalcogenides, can be used because of their stable room temperature exciton. More specifically, in certain aspects, organic heterostructures (homogenous and inhomogeneous) may be used, such as, for example only, BPhen/mMTDATA, 3TPYMB/mMTDATA, Ir(ppy)3/PCBM, and the like. In certain other aspects, inorganic heterostructures of transition metal dichalcogenides (such as, $MoS_2$, $WSe_2$, $MoSe_2$, $WSe_2$, and the like) and/or mixture of quantum dots with different emission wavelength may be used, by way of non-limiting example. In still further aspect an organic/inorganic blend (heterostructures) may be used, including, for example only, organic semiconductors dyes, pentacene, tetracene, rubrene, and the like with inorganic semiconductor materials such as transition metal dichalcogenides, III-V semiconductors, and the like. Such blends may exist as mixtures and/or in the form of one or more separately disposed layers.

In this fashion, the wedge 102 enable the distance (or depth) of the deposited excitonic material 106 from the underlying substrate 104. FIG. 1A is a scanning electron microscope ("SEM") image showing the wedge 102 and the deposited exciton material 106. FIG. 1B is the photoluminescence lifetime (1/rate of emission) map of the wedge 102. As seen in FIG. 1B, a clear interference pattern is observed along the wedge 102. This pattern is analogous to a contour map. The contours correspond to areas of constant height from the underlying mirror (i.e., substrate 104). An intensity map looks similar to that shown in FIG. 1B. These images show that the local density of optical states is altered as a result of proximity to the mirror (i.e., substrate 104). The distance from the mirror, determines the nature of interference (constructive or destructive), thus directly affecting the intensity and lifetime of the exciton. That is, in various aspects, absorption of each excitonic species, photoluminescence of each excitonic species, formation efficient of change transfer ("CT") excitons, photoluminescence of change transfer ("CT") excitons, and/or emission rates of excitonic species (including change transfer ("CT") excitonics) may each be a function of the distance from the mirror.

Figure 2:
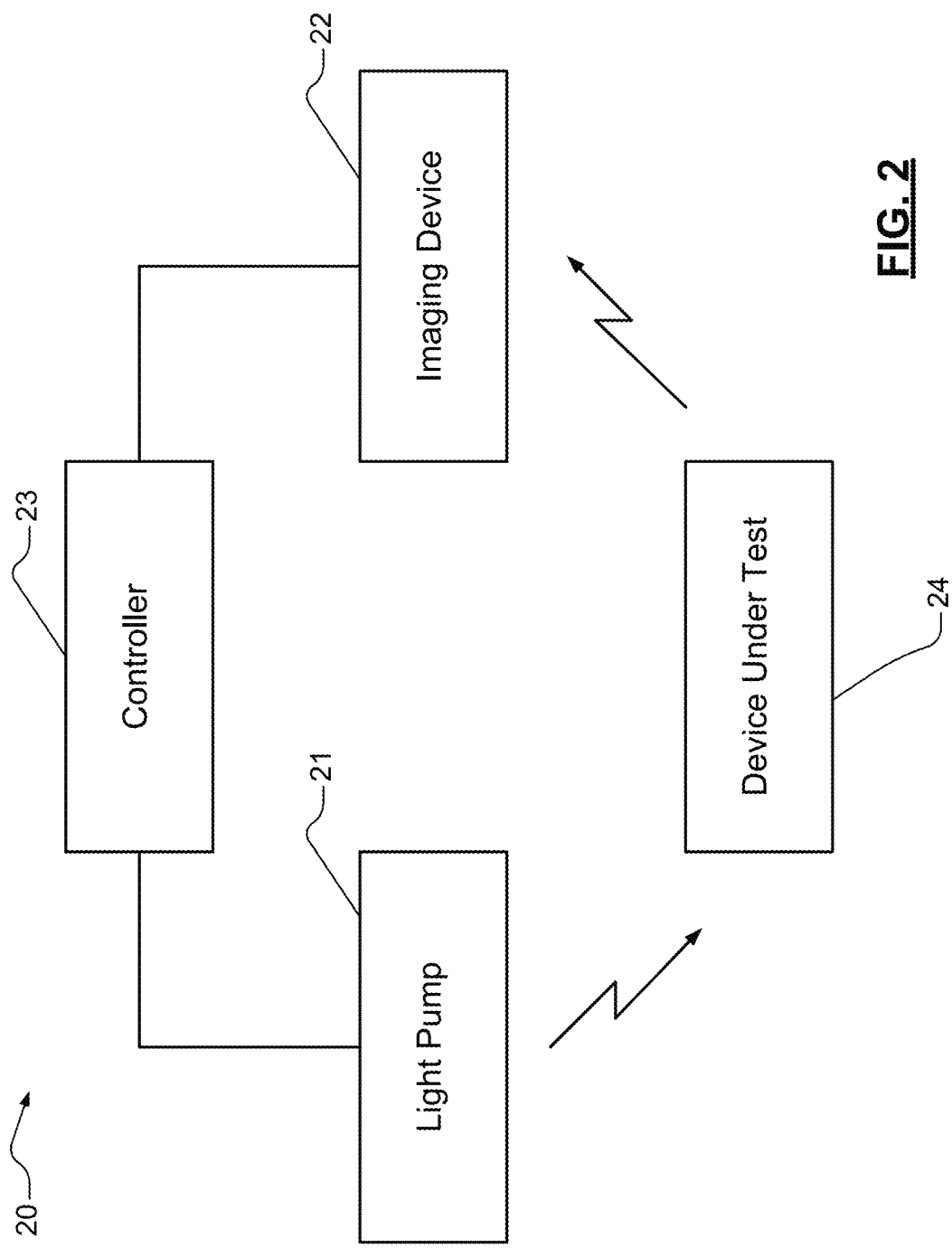
FIG. 2 is a schematic block diagram that illustrates an example imaging system for implementing imaging techniques in accordance with various aspects of the current technology.

FIG. 2 depicts an example imaging system 20 for implementing imaging techniques in accordance with various aspects of the current disclosure. The imaging system 20 includes a light source 21, an imaging device 22, and a controller 23. The imaging system 20 may be configured to image the device to be tested. For example, in one instance, as detailed further below, the device or object to be tested (i.e., device under test) 24 may be an integrated circuit, which includes at least one interconnect therein. The integrated circuit may also include a layer including one or more materials having excitonic properties (e.g., an organic semiconductor thin film or an inorganic semiconductor), where the excitonic material (single or blend) is deposited into a top surface of the integrated circuit. While reference is made to an integrated circuit throughout this disclosure, it should be understood that the imaging techniques described herein are also applicable to other types of objects as well, such as barcodes.

The light source 21 may be a pumping laser configured to project an interrogating beam of light towards a top surface of the device or object under test (e.g., integrated circuit) 24. The wavelength of the interrogating beam is preferably designed to be shorter than the wavelength of the optic response emitted from the excitonic material. In some instance, the interrogating beam may use higher order non-linear processes to excite the excitonic material, such that the wavelength of the interrogating beam may be longer than the wavelength of the optic response emitted from the excitonic material. The light source 21 may be interfaced with the controller 23. The controller 23 may be configured to set and/or adjust the wavelength of the interrogating beam emitted from the light source 21. In other embodiments, the light source 21 may include two or more lasers (for example, two or more pumping lasers), which can be configured to emit at different wavelengths. In such instances, the controller 23 can selectively control which of the two lasers emit at a given time.

The imaging device 22 is configured to capture the optic response of the excitonic material to the interrogation beam. In one example, the imaging device 22 may be a charged-couple device (CCD), or in certain aspects, a detector capable of measuring lifetime. One or more filters may also be used to prevent out unwanted emissions from reaching the imaging device 22. The controller 23 may also communicate with the imaging device 22 so as to receive imaging data from the imaging device 22. The controller 23 may be configured to compute distances (i.e., depths) between the one or more interconnects embedded in the integrated circuit and the layer of excitonic material. For example, the emission of the excitonic material may be a function of the distance between the interconnects and the layer of excitonic material, such as further described below. In an example embodiment, the controller 23 may be implemented as a microcontroller. It should be understood that the logic for the controller 23 can be implemented in hardware logic, software logic, or a combination thereof. In this regard, controller 23 can be or can include any of a digital signal processor (DSP), microprocessor, microcontroller, or other programmable device, which are programmed with software implementing the above described methods. It should be understood that alternatively the controller 23 may be or may include other logic devices, such as a Field Programmable Gate Array (FPGA), a complex programmable logic device (CPLD), or application specific integrated circuit (ASIC), by way of non-limiting example. When it is stated that controller 23 performs a function or is configured to perform a function, it should be understood that controller 23 is configured to do so with appropriate logic (such as in software, logic devices, or a combination thereof).

FIG. 3 is a cross sectional view of an example integrated circuit 300. For example, the integrated circuit 300 includes an interconnect layer 332 disposed on a semiconductor layer 333 and an excitonic layer 331 deposed on an exposed surface of the interconnect layer 332. One or more electrical interconnects 334 may be embedded in the interconnect layer 332. For example, as illustrated three electrical interconnects 334 may be embedded in the interconnect layer 332. The interconnect layer 332 may comprise one or more insulators or insulating materials, such as glass (e.g., silica ($SiO_2$)). The excitonic layer 331 may include one or more materials having excitonic properties.

For example, in various aspects, by combining multiple excitonic species, a complete three-dimensional profile of different layers of metallic interconnects can be formed based on ratio of different excitonic properties and the relative intensities. The combination of materials having excitonic properties may help select the correct distance/depth from multiple solutions so as to increase the dynamic range of the technique. Combining multiple excitonic species may also enable covering large emission spectrum that further allows probing of wide range of interconnect depths. For example, charge transfer ("CT") states (also known as, interlayer excitons in inorganic semiconductor and exciplex systems in organic semiconductors) have long been used in optoelectronic devices as highly tunable emission layer. Such states are formed at the interface of two materials whose energy bandgaps have an offset. For example, in organic materials, the emission wavelength from the blend can be tuned by changing the ratio of donor and acceptor molecules. These excitonic states experience the same enhancement/reduction with distance from the mirror as discussed in the case of a single excitons. Hence the emission from the heterostructures are strongly modified by the different layers of metal interconnects.

FIG. 3 illustrates the relationship between measured lifetime of the emission from the excitonic material and the distance between the excitonic material and the embedded interconnects. Though lifetime is discussed, the skilled artisan would understand that an intensity image would show similar variation. For example, at a minima, a distance between the excitonic layer 331 (and the one or more materials having excitonic properties) and one of the one or more electrical interconnects 334 may be given by $d=\lambda n/4$, where $\lambda$ is wavelength of the emission and n is the index of refraction of the interconnect layer 332. At a maxima, the distance between the excitonic layer 331 (and the one or more materials having excitonic properties) and one of the one or more electrical interconnects 334 may be given by $d=\lambda n/2$, where $\lambda$ is wavelength of the emission and n is the index of refraction of the interconnect layer 332. By knowing the index of refraction and determining the wavelength of the emission from the excitonic layer 331 (i.e., the one or more materials having excitonic properties), the distance (or depth) of the selected interconnect 334 can be estimated by a controller (such as controller 23 illustrated in FIG. 2). The object of interest (e.g., integrated circuit 300) can be interrogated with light at different wavelengths to improve the depth estimation accuracy. The skilled artisan will appreciate that these conditions are reversed in the instance of lifetime of emission, for example, an increase in intensity corresponds to a decrease in lifetime. Increases in the instance of intensity occurs because the emission from the excitonic states occur at a faster rate, which results in lowering the lifetime of the exciton.

Figures 4A, 4B:
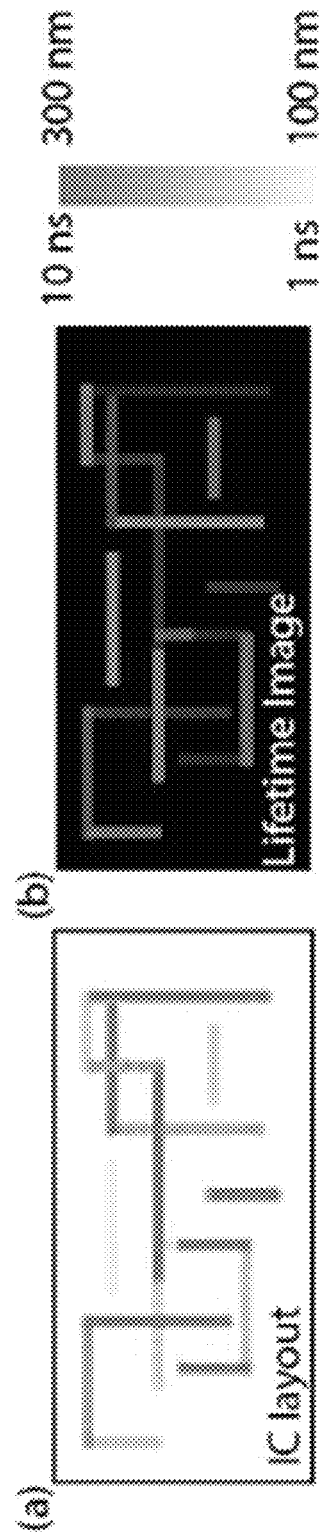
FIG. 4A is a top-down schematic view of an example layout for an integrated circuit, such as the example integrated circuit illustrated in FIG. 3.
FIG. 4B is an exciton lifetime image of the integrated circuit illustrated in FIG. 4A.

Additionally, the intensity (or lifetime) of the emission from the excitonic layer 331 (i.e., the one or more materials having excitonic properties) can also be measured and used to construct a two-dimensional or three-dimensional image of the one or more interconnects 334 in the integrated circuit 300. For example, FIG. 4A is a top-down schematic view of an example layout for an integrated circuit, such as integrated circuit 300 illustrated in FIG. 3. By measuring the emission intensity (or lifetime) from the excitonic layer 331 (i.e., the one or more materials having excitonic properties), an image of the integrated circuit 300 can be constructed as seen in FIG. 4B. This is merely intended to be illustrative. It should be understood that other views, including three-dimensional ("3D") views, could also be constructed using the imaging techniques set forth in this disclosure.

Excitonic properties may also be affected by external electric fields. For example, an exciton can be viewed as a dipole, which has a potential that can be changed by surrounding electric fields. In the presence of an external field, exciton potential is varied according to $\vec{p} \cdot \vec{E}$, where $\vec{p}$ is the exciton dipole moment and E is the external field. The shift in energy levels contribute to the change in the excitonic properties, such as diffusion length and exciton energy. The solvatochromic shift results in an energy gradient that directs the random walk diffusion along the direction of the gradient. Based on this principle, in certain instances, the imaging technique detailed above can be enhanced by injecting an electrical signal into the integrated circuit (such as integrated circuit 300 illustrated in FIG. 3) during the imaging process. The time dependent local voltage in the interconnect layer 332 of the integrated circuit 300 can affect the local electric fields surrounding the exciton material 300 so as to change the exciton potential and modulating the excitonic drift, as illustrated in FIG. 5. Such an approach provides topographical images that respond to dynamical changes. For instance, a known sequence of bits will correspond to a conjugate pattern of exciton drift (in time), thus adding an extra layer of detection reliability.

In one aspect, the non-destructive imaging technique discussed above can be used to create topography images (depth) from two-dimensional ("2D") images. For instance, three-dimensional ("3D") barcode can store significantly more information than one-dimensional ("1D") or two-dimensional ("2D") barcodes. However, reading the depth information of a barcode is not easy—for example, measuring the time of flight of a light pulse would require electronics with timing accuracy in femto seconds Referring to FIGS. 6A-6C, a three-dimensional barcode 660 with different depth profiles is illustrated. The three-dimensional barcode 660 may be a matrix of black and white pixels arranged in unique patterns 664. For example, as illustrated, the three-dimensional barcode 660 may include a pattern 664 where portions of the patterns are formed at different heights from an underlying substrate 662. As illustrated in FIG. 6B, the three-dimensional barcode 660 may be immersed in a transparent material 670. The transparent material 670 may include, for example, silicon dioxide or polymer. As illustrated, the transparent material 670 may be planarized. As illustrated in FIG. 6C, a thin layer 661 that includes one or more materials having excitonic properties may be disposed on an exposed surface of the transparent material 670. The three-dimensional barcode 660 can be read using the imaging technique described above, where the emissions of the one or more excitonic material is a function of the distance between the different heights of pixels and the layer of excitonic material. By scanning the area of the three-dimensional barcode 660, the value of the code represented can be determined. Though not specifically detailed, other applications for this non-destructive imaging technique are also contemplated by this disclosure.

The terminology used herein is for the purpose of describing particular example embodiments only and is not intended to be limiting. As used herein, the singular forms "a," "an," and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When an element or layer is referred to as being "on," "engaged to," "connected to," or "coupled to" another element or layer, it may be directly on, engaged, connected or coupled to the other element or layer, or intervening elements or layers may be present. In contrast, when an element is referred to as being "directly on," "directly engaged to," "directly connected to," or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the example embodiments.

Spatially relative terms, such as "inner," "outer," "beneath," "below," "lower," "above," "upper," and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

What is claimed is:

1. A non-destructive method for collecting data from three-dimensional objects, the method comprising:
    directing one or more interrogating beams of light towards a surface of a three-dimensional object, wherein the three-dimensional object includes one or more underlying surfaces, and one or more materials having excitonic properties are disposed on the surface of the three-dimensional object;
    capturing, using an imaging device, optic response of the one or more materials having excitonic properties to the one or more interrogation beams; and
    computing, using the imaging device, a distance between the one or more underlying surfaces and the one or more materials having excitonic properties, wherein the optic response of the one or more materials having excitonic properties is a function of the distance between the one or more materials having excitonic properties and the one or more underlying surfaces.

2. The method of claim 1, wherein the one or more materials having excitonic properties form an excitonic layer.

3. The method of claim 2, wherein the excitonic layer includes at least one of an organic semiconductor thin film and an inorganic semiconductor thin film.

4. The method of claim 2, wherein the excitonic layer is blended layer including inorganic and organic materials.

5. The method of claim 2, wherein the method further comprises disposing the excitonic layer on the surface of the three-dimensional object.

6. The method of claim 5, wherein the three-dimensional object is an integrated circuit.

7. The method of claim 6, wherein the method further comprises:
    comparing the distance between the one or more underlying surfaces and the excitonic layer to a product specification for the integrated circuit; and
    tagging the integrated circuit as a counterfeit when the distance between the one or more underlying surfaces and the excitonic layer differs substantially from the product specification for the integrated circuit.

8. The method of claim 2, wherein the method further comprises:
    disposing a transparent material on exposed surfaces of the one or more underlying surfaces and disposing the excitonic layer on an exposed surface of the transparent material so as to define the surface of the three-dimensional object.

9. The method of claim 8, wherein the three-dimensional object is a barcode.

10. The method of claim 1, wherein wavelengths of the one or more interrogating beam are different from the optic response wavelengths emitted from the one or more materials having excitonic properties.

11. The method of claim 10, wherein wavelengths of the one or more interrogating beam are shorter than the optic response wavelengths emitted from the one or more materials having excitonic properties.

12. The method of claim 11, wherein wavelengths of the one or more interrogating beam are longer than the optic response wavelengths emitted from the one or more materials having excitonic properties.

13. The method of claim 1, wherein the one or more interrogating beams of light are directed towards an exposed surface of three-dimensional object using one or more lasers.

14. The method of claim 1, wherein the method further comprises:
    injecting an electric signal into the three-dimensional object while directed the one or more interrogating beams of light towards the surface of the three-dimensional object.

15. The method of claim 14, wherein the method further comprises:
    monitoring exciton drift over time in the optical response of the one or more materials having excitonic properties while the electrical signal is injected into the three-dimensional object.

16. A non-destructive method for collecting data from an integrated circuit, the method comprising:
    directing one or more interrogating beam of light towards a surface of the integrated circuit, wherein the integrated circuit includes one or more interconnects, and an excitonic layer including one or more materials having excitonic properties is disposed on the surface of the integrated circuit;
    capturing, using an imaging device, optic response of the excitonic layer to the one or more interrogation beams; and
    computing, using the imaging device, a distance between the one or more interconnects and the excitonic layer, wherein the optical response of the one or more materials having excitonic properties is a function of the distance between the excitonic layer and the one or more interconnects.

17. The method of claim 16, wherein the method further comprises:
    constructing a three-dimensional image of the integrated circuit.

18. The method of claim 16, wherein the method further comprises:
    comparing the distance between the one or more underlying surfaces and the excitonic layer to a product specification for the integrated circuit; and
    tagging the integrated circuit as a counterfeit when the distance between the one or more underlying surfaces and the excitonic layer differs substantially from the product specification for the integrated circuit.

19. A non-destructive method for collecting data from a three-dimensional barcode, the method comprising:
    directing one or more interrogating beam of light towards a surface of the barcode, wherein the barcode includes a plurality of objects having different heights, plurality of objects define a pattern, and an excitonic layer including one or more materials having excitonic properties is disposed on the surface of the barcode;
    capturing, using an imaging device, optic response of the excitonic layer to the one or more interrogation beams; and
    computing, using the imaging device, a distance between the objects and the excitonic layer, wherein the optical response of the one or more materials having excitonic properties is a function of the distance between the excitonic layer and the plurality of objects.

20. The method of claim 19, wherein the method further comprises:
    disposing a transparent material on exposed surfaces of the objects and disposing the excitonic layer on an exposed surface of the transparent material so as to define the surface of the barcode.

\* \* \* \* \*